United States Patent
Sadovnikov et al.

(10) Patent No.: US 9,640,611 B2
(45) Date of Patent: May 2, 2017

(54) HV COMPLEMENTARY BIPOLAR TRANSISTORS WITH LATERAL COLLECTORS ON SOI WITH RESURF REGIONS UNDER BURIED OXIDE

(71) Applicant: Texas Instruments Incorporated, Dallas, TX (US)

(72) Inventors: Alexei Sadovnikov, Sunnyvale, CA (US); Jeffrey A. Babcock, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 87 days.

(21) Appl. No.: 14/219,760

(22) Filed: Mar. 19, 2014

(65) Prior Publication Data
US 2015/0270335 A1    Sep. 24, 2015

(51) Int. Cl.
| | | |
|---|---|---|
| *H01L 29/732* | (2006.01) | |
| *H01L 27/082* | (2006.01) | |
| *H01L 29/00* | (2006.01) | |
| *H01L 29/06* | (2006.01) | |
| *H01L 27/12* | (2006.01) | |
| *H01L 29/08* | (2006.01) | |

(Continued)

(52) U.S. Cl.
CPC ...... *H01L 29/0634* (2013.01); *H01L 27/1203* (2013.01); *H01L 29/0821* (2013.01); *H01L 29/10* (2013.01); *H01L 29/66265* (2013.01); *H01L 29/66272* (2013.01); *H01L 29/732* (2013.01); *H01L 27/082* (2013.01); *H01L 29/0649* (2013.01)

(58) Field of Classification Search
CPC ... H01L 29/06; H01L 27/082; H01L 29/0634; H01L 29/0821; H01L 29/732

USPC .......................................................... 257/526
See application file for complete search history.

(56) References Cited

U.S. PATENT DOCUMENTS

| | | | |
|---|---|---|---|
| 5,344,785 A | | 9/1994 | Jerome et al. |
| 5,426,062 A | * | 6/1995 | Hwang ............... H01L 27/1203 |
| | | | 148/DIG. 150 |

(Continued)

FOREIGN PATENT DOCUMENTS

CN    101673715    3/2010

OTHER PUBLICATIONS

PCT Application No. PCT/US15/21566 Search Report mailed Mar. 19, 2015.

(Continued)

*Primary Examiner* — John C Ingham
*Assistant Examiner* — Ismail Muse
(74) *Attorney, Agent, or Firm* — Tuenlap D. Chan; Charles A. Brill; Frank D. Cimino (57) ABSTRACT

Complementary high-voltage bipolar transistors in silicon-on-insulator (SOI) integrated circuits is disclosed. In one disclosed embodiment, a collector region is formed in an epitaxial silicon layer disposed over a buried insulator layer. A base region and an emitter are disposed over the collector region. An n-type region is formed under the buried insulator layer (BOX) by implanting donor impurity through the active region of substrate and BOX into a p-substrate. Later in the process flow this n-type region is connected from the top by doped poly-silicon plug and is biased at Vcc. In this case it will deplete lateral portion of PNP collector region and hence, will increase its BV.

7 Claims, 7 Drawing Sheets

(51) Int. Cl.
*H01L 29/66* (2006.01)
*H01L 29/10* (2006.01)

(56) References Cited

U.S. PATENT DOCUMENTS

| | | | | |
|---|---|---|---|---|
| 6,130,458 | A | * | 10/2000 | Takagi ............... H01L 21/743 257/341 |
| 6,177,701 | B1 | * | 1/2001 | Matsumoto ......... H01L 23/522 257/310 |
| 6,329,265 | B1 | * | 12/2001 | Miyawaki ........... H01L 21/2007 257/E21.122 |
| 6,365,447 | B1 | | 4/2002 | Hebert et al. |
| 6,770,952 | B2 | | 8/2004 | Babcock et al. |
| 6,878,605 | B2 | | 4/2005 | Kim et al. |
| 7,582,935 | B2 | | 9/2009 | Kim et al. |
| 2002/0019105 | A1 | * | 2/2002 | Hattori .............. H01L 21/76256 438/311 |
| 2003/0134481 | A1 | * | 7/2003 | Fallica ............... H01L 21/8221 438/311 |
| 2004/0207046 | A1 | * | 10/2004 | Babcock ................ H01L 21/84 257/575 |
| 2006/0068542 | A1 | * | 3/2006 | Orlowski .......... H01L 21/82387 438/207 |
| 2006/0231891 | A1 | * | 10/2006 | Wang .................. H01L 21/743 257/347 |
| 2012/0313172 | A1 | * | 12/2012 | Matsudaira ............ H01L 21/84 257/347 |

OTHER PUBLICATIONS

English Machine Translation of CN101673715A.
"A Review of RESURF Technology," Power Semiconductor Devices and ICs, 2000, Proceedings, The 12th International Symposium on Digital Object Identifier, pp. 11-18 (Adriaan W. Ludikhuize).

* cited by examiner

HV COMPLEMENTARY BIPOLAR TRANSISTORS WITH LATERAL COLLECTORS ON SOI WITH RESURF REGIONS UNDER BURIED OXIDE

FIELD OF THE INVENTION

This invention is in the field of bipolar transistor fabrication, and is more specifically directed to the fabrication of transistors having varying characteristics on a common substrate according to silicon-on-insulator (SOI) technology.

BACKGROUND OF THE INVENTION

Integrated circuits have utilized bipolar junction transistors for many years, taking advantage of their high gain characteristics to satisfy high performance and high current drive needs. In particular, as is well known in the art, bipolar transistors are especially well-suited for high frequency applications, such as now used in wireless communications.

Silicon-on-insulator (SOI) technology is also well-known in the art as providing important advantages in high-frequency electronic devices. As is fundamental in SOI technology, active devices such as transistors are formed in single-crystal silicon layers formed over an insulator layer, such as a layer of silicon dioxide commonly referred to as buried oxide (BOX). The buried oxide layer isolates the active devices from the underlying substrate, effectively eliminating parasitic nonlinear junction capacitances to the substrate and reducing collector-to-substrate capacitances. To the extent that high frequency performance of bulk transistors was limited by substrate capacitance, SOI technology provides significant improvement.

In addition, SOI devices are robust in high voltage applications. The buried oxide layer effectively eliminates any reasonable possibility of junction breakdown to the substrate.

However it has been observed that those transistor features that facilitate high frequency performance tend to weaken the device from a high bias voltage standpoint, and vice versa. This tradeoff has typically been addressed by separately manufacturing high voltage integrated circuits and high performance integrated circuits, with each integrated circuit having transistors optimized for their particular implementation. This is because the process complexity resulting from integrating both high voltage and high performance devices in the same SOI integrated circuit adds significant cost and exerts manufacturing yield pressure.

A conventional SOI bipolar transistor is designed to be a high performance device. However, a high performance transistor is somewhat limited by its construction, from a standpoint of both breakdown voltage and performance. As is fundamental in the art, the collector emitter breakdown voltage (BVCEO) depends upon the thickness of collector region and upon the doping concentration of the collector region. Lighter doping of the collector region and a thicker collector region would increase this breakdown voltage.

In a real circuit, the emitter and base of a PNP is biased around the highest potential Vcc (relative to grounded substrate) while the collector is switched between Vcc and 0. High B-C bias corresponds to zero potential at collector. At this condition grounded p-substrate does not deplete lateral portion of collector region and, hence, does not help to increase BV.

The emitter and base of an NPN is biased around the lowest potential GND (relative to grounded substrate) while the collector is switched between Vcc and 0. High B-C bias corresponds to VCC potential at collector. At this condition grounded p-substrate depletes lateral portion of collector region and, hence, helps to increase BV.

What is needed is a method of increasing PNP BV without decreasing collector doping concentration or increasing collector region thickness of the PNP while including a high voltage NPN on the same circuit/substrate.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, an integrated circuit structure including both NPN and PNP high voltage transistors, the integrated circuit structure including both NPN and PNP high voltage transistors comprising: complementary PNP and NPN structures; wherein the PNP and NPN structures include an SOI semiconductor structure comprising: an p-type region; active PNP and NPN device regions; a buried insulator layer BOX that lies therebetween, touches, and electrically isolates p-type region from the active PNP and NPN regions; wherein both the p-type region and the active device PNP and NPN regions are implemented with single-crystal silicon; and an n-type region is included under the buried insulator layer BOX of the PNP transistor, by implanting donor impurities of through the active device region of the SOI wafer and BOX into the p-type region.

In accordance with another embodiment of the present application, an integrated circuit structure including both NPN and PNP high voltage transistors, the integrated circuit structure including both NPN and PNP high voltage transistors comprising: complementary PNP and NPN structures; wherein the PNP and NPN structures include an SOI semiconductor structure comprising: an n-type region; active PNP and NPN device regions; a buried insulator layer BOX that lies therebetween, touches, and electrically isolates the n-type region from the active PNP and NPN device regions; wherein both the n-type region and the active PNP and NPN device regions are implemented with single-crystal silicon; an n-type region is included under the buried insulator layer BOX of the PNP transistor, by implanting donor atoms through the active device region of the SOI wafer and BOX into the n-type region; a p-type region is included under the buried insulator layer BOX of the NPN transistor, by implanting acceptor impurities through the active device region of the SOI wafer and BOX into n-type region.

DESCRIPTION OF THE VIEWS OF THE DRAWING

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
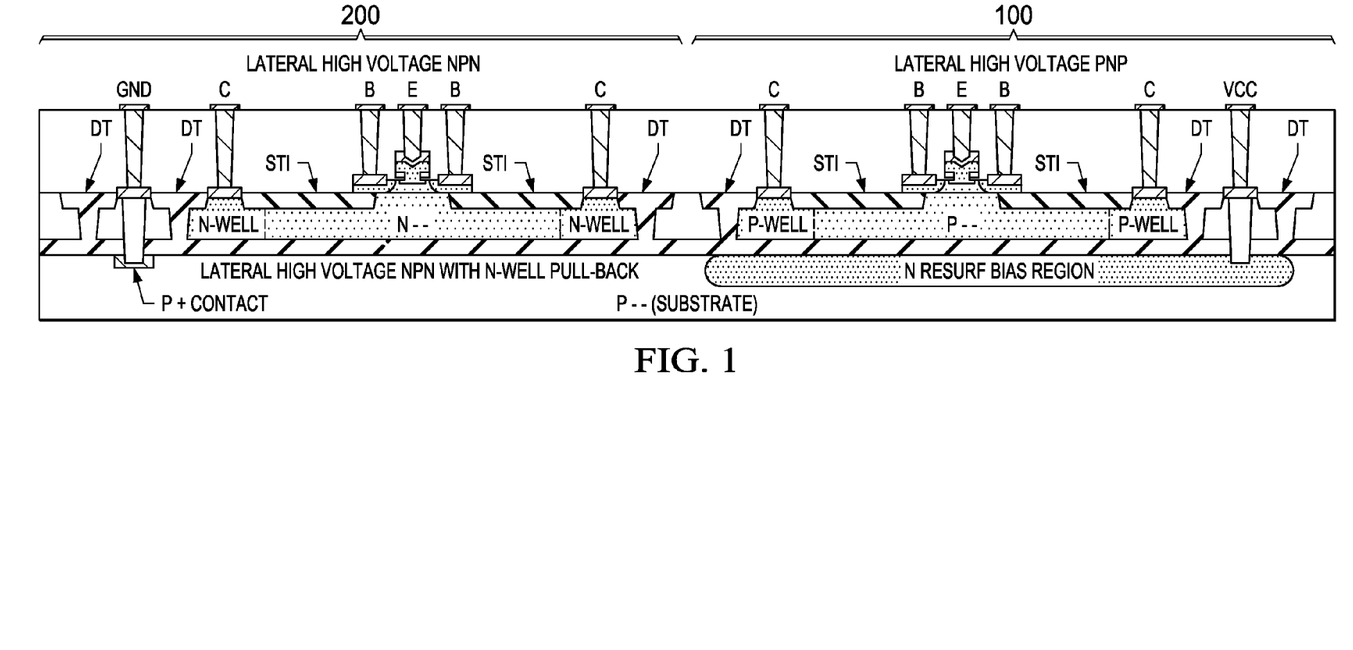
FIG. 1 illustrates a cross-section of an embodiment of the present invention.
Figure 1A:
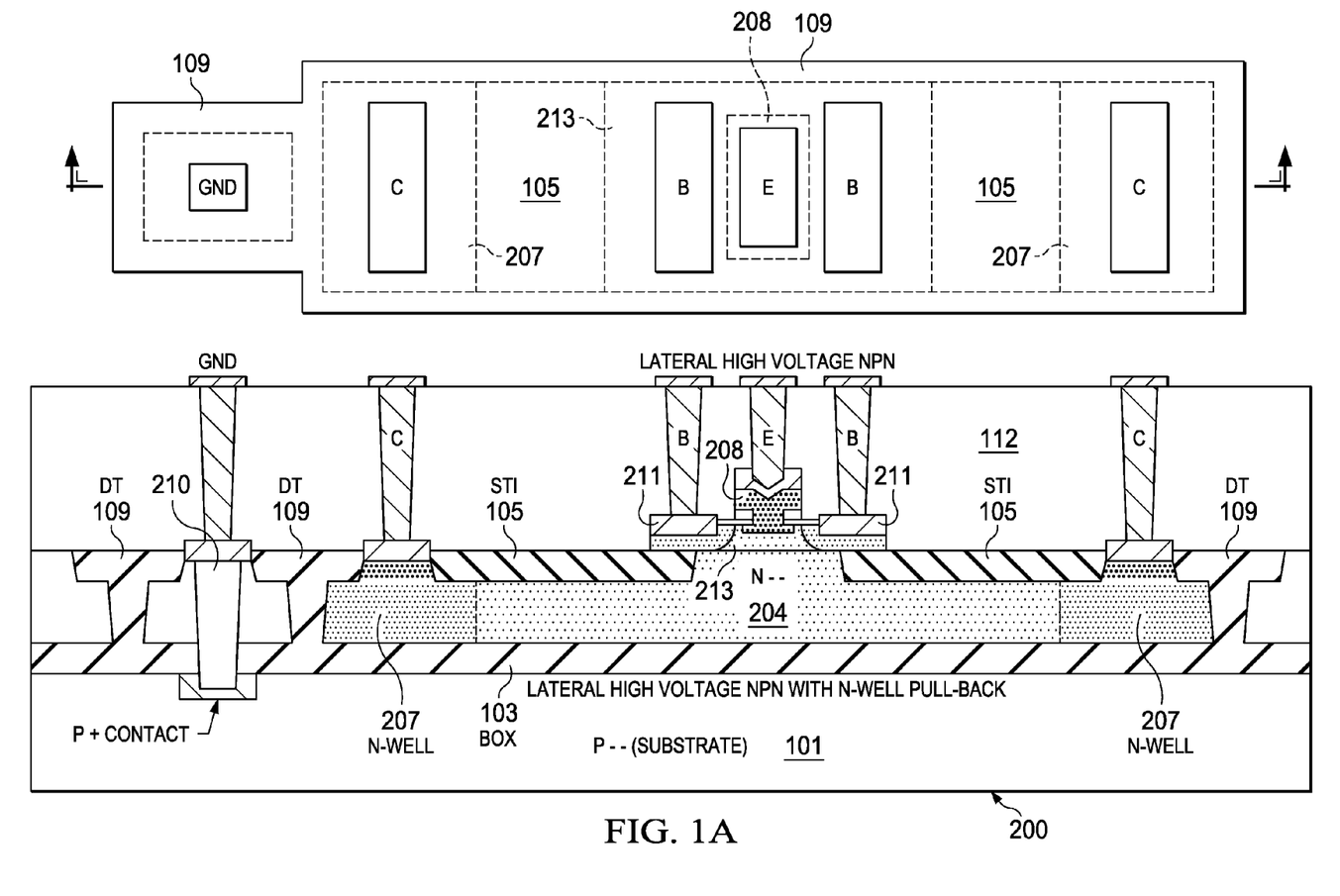
FIG. 1A illustrates an enlarged portion of FIG. 1 detailing the NPN transistor.
Figure 1B:
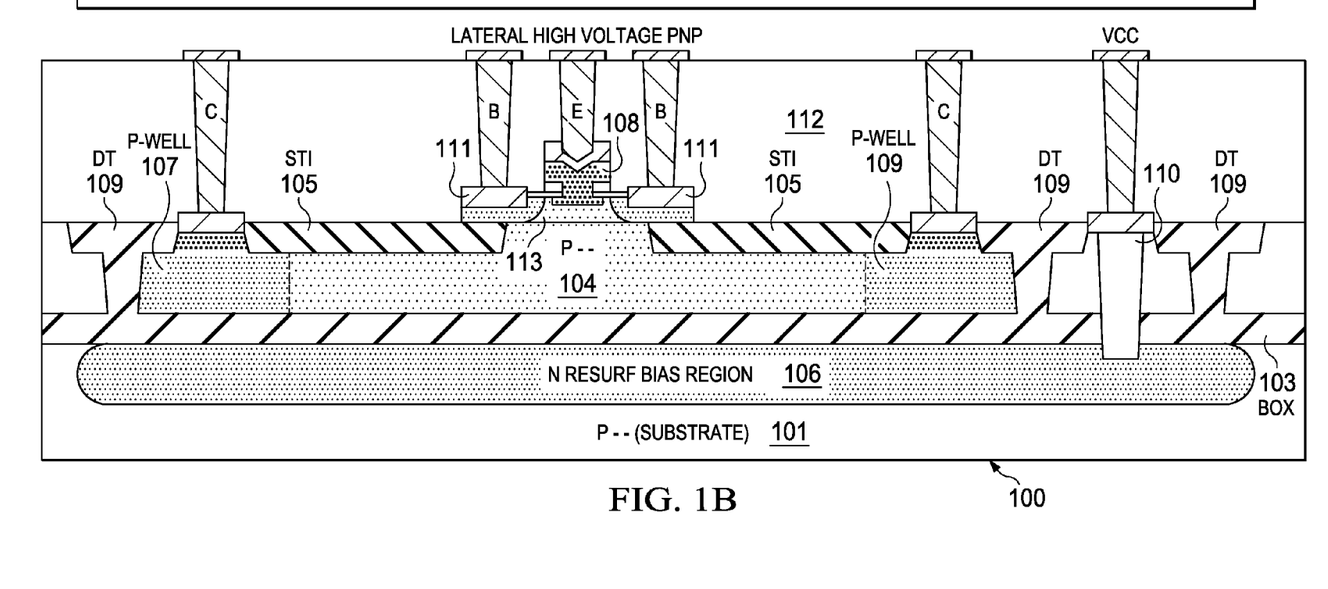
FIG. 1B illustrates an enlarged portion of FIG. 1 detailing the PNP transistor.

In an embodiment of the present invention is shown in FIGS. 1-1B, the complementary PNP 100 and NPN 200 structures include an SOI semiconductor structure having an p-type region 101, active device regions 104 and 204 respectively, and a buried insulator layer (BOX) 103 that lies therebetween, touches, and electrically isolates p-type region 101 from the active device regions 104 and 204. The initial doping level of the active device regions 104 and 204 can be n-type, ~1e14 l/cm3. In the present example, both the p-type region 101 and the active device regions 104 and 204 are implemented with single-crystal silicon. To create a structure that has higher PNP BV, an n-type region 106 is included under the buried insulator layer (BOX) of the PNP transistor 100, by implanting donor impurities with dose of about 1e13 to 1e14 l/cm2 through the active device region of the SOI wafer and BOX 103 (1.5-2 um in total) into p-type region 101. Later in the process flow this n-type region 106 and the p-type regions 101 are connected from the top by doped poly-silicon plugs and are biased at Vcc and GND respectively. Since the substrate is p-type material, GND can be applied to either the p-type region 101 or the top contact GND. In this case it will deplete lateral portions of both the PNP and NPN collector regions and hence, will increase their BVs.

The structure providing a PNP transistor 100 with a higher BV (FIG. 1B) is described below.

First an SOI wafer is provided as described in the present invention as shown in FIGS. 1-1B.

Next, a first masking and implant step is accomplished to create a highly (~1e17 l/cm3) doped n-layer 106 under BOX 103 in PNP area. The highly doped n-layer 106 is vertically under the PNP area and extends toward an n-type poly-silicon plug 110 and couples to that plug.

A second masking and implant step after Pad Oxidation, before Nitride deposition is performed to create a uniform collector doping between 3e14-3e16 in active device region 104.

A Third masking and etching step is accomplished to provide a hard mask for defining and for deposition of an insulator layer STI 105 in the active device region 104.

Deep trenches 109 are formed to encircle the PNP transistor 100 and the n-type poly-silicon plug 110. The trenches extend from the top of the die to the bottom of the BOX 103 and the n-type poly-silicon plug extends from the top of the die to and through the BOX 103 extending into the highly doped n-layer 106 under the BOX 103, wherein the n-type poly-silicon plug touches the implanted n-layer under the BOX 103 and extends to the top of die providing a top contact to the implanted n-layer.

A base epitaxial semiconductor layer 113 is deposited within an epitaxial layer 112, defined and doped with an impurity of the opposite conductivity type on top of the active device region 104 with base contacts 111 coupled thereto.

And finally, an emitter region 108 covers a portion of the base epitaxial semiconductor layer 113, wherein the emitter region 108 is highly doped with the same conductivity type as the active device region 104.

The structure providing an NPN transistor 200 with a high BV FIG. 1A is described below.

First an SOI wafer is provided as described in the present invention as shown in FIGS. 1-1B.

A first masking and implant step after Pad Oxidation, before Nitride deposition is performed to create a uniform collector doping between 3e14-3e16 l/cm3 in active device region 204.

A second masking and etching step is accomplished to provide a hard mask for defining and to for deposition of an insulator layer STI 105 in the active device region 204.

Deep trenches 109 are formed, to encircle the NPN 200 transistor and the p-type poly-silicon plug 210. The trenches extend from the top of the die to the bottom of the BOX 103 and the p-type poly-silicon plug extends from the top of the die to and through the BOX 103 extending into the p-layer 101 under the BOX 103, wherein the p-type poly-silicon plug touches the p-layer under the BOX 103 and extends to the top of die providing a top contact to the p-layer 101.

A base epitaxial semiconductor layer 213 is deposited, defined and doped with an impurity of the opposite conductivity type on top of the active device region 204 with base contacts 211 coupled thereto.

And finally an emitter region 208 covers a portion of the base epitaxial semiconductor layer 213, wherein the emitter region 208 is highly doped with the same conductivity type as the first epitaxial layer 204.

The base epitaxial semiconductor for the NPN and the PNP can be either SiGe or silicon. The base epitaxial semiconductor can also be deposited in two operations, one for the NPN and one for the PNP.

Figure 2:
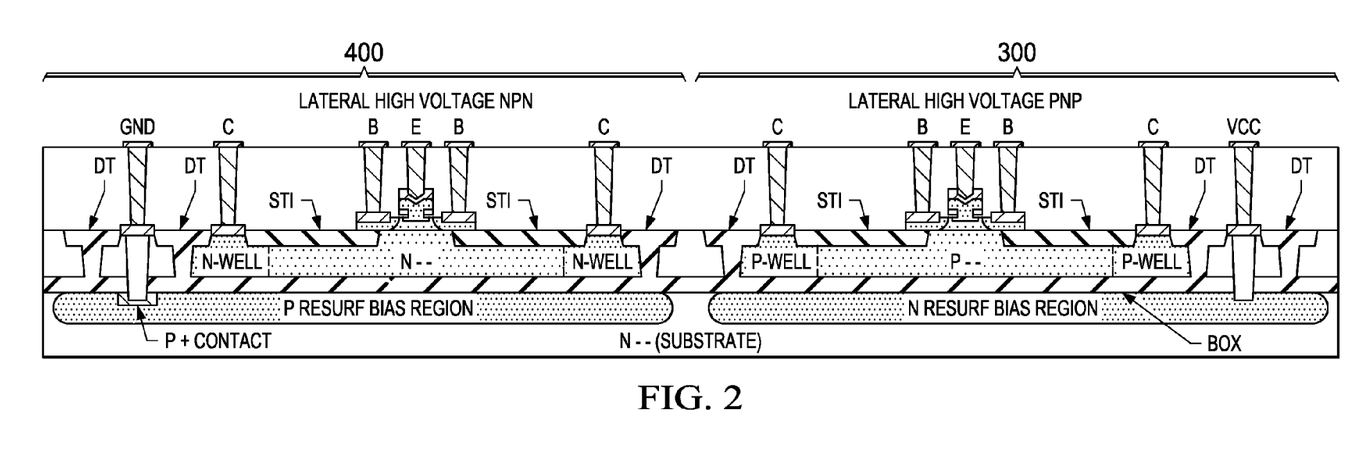
FIG. 2 illustrates a cross-section of another embodiment of the present invention.
Figure 2A:
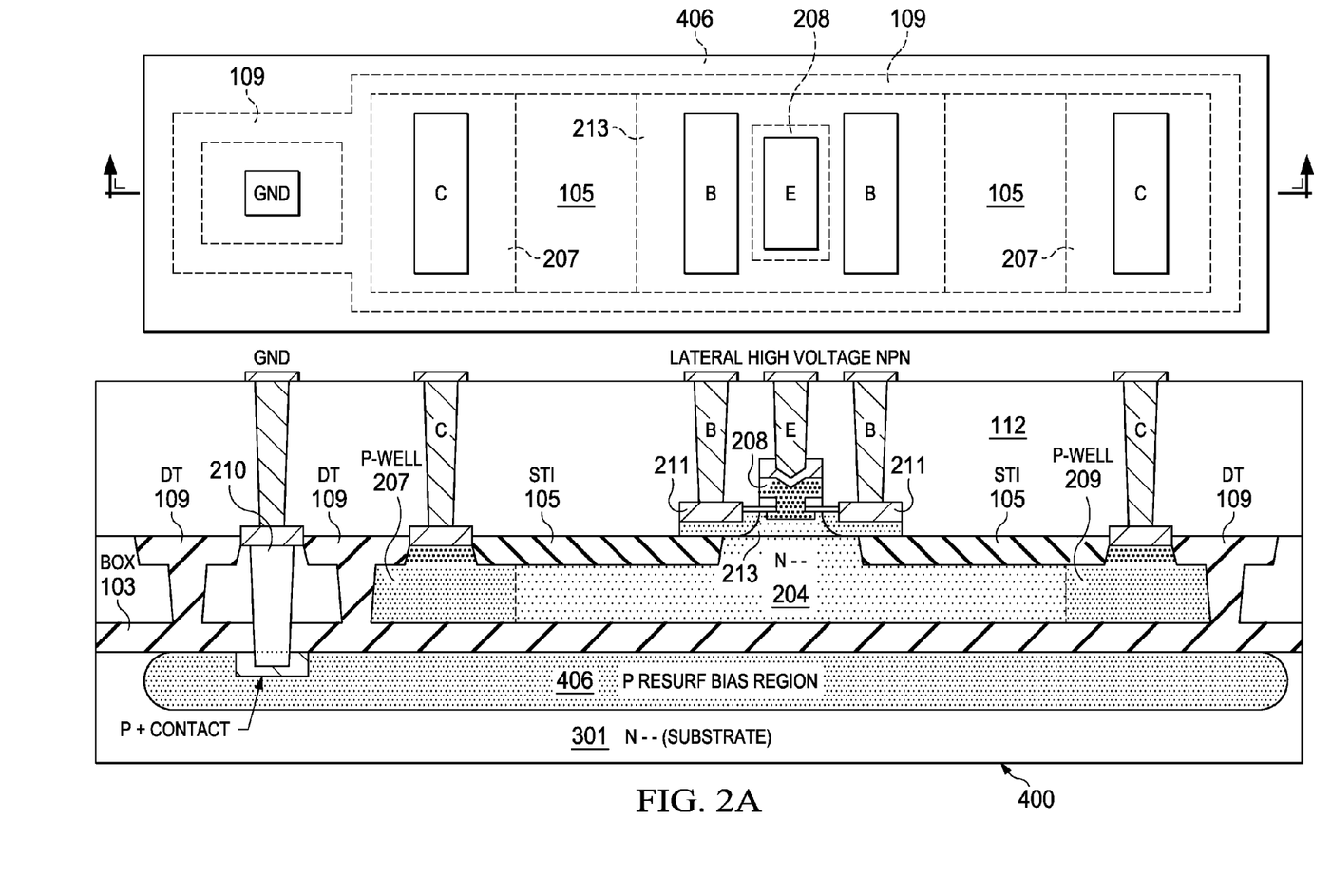
FIG. 2A illustrates an enlarged portion of FIG. 2 detailing the NPN transistor.
Figure 2B:
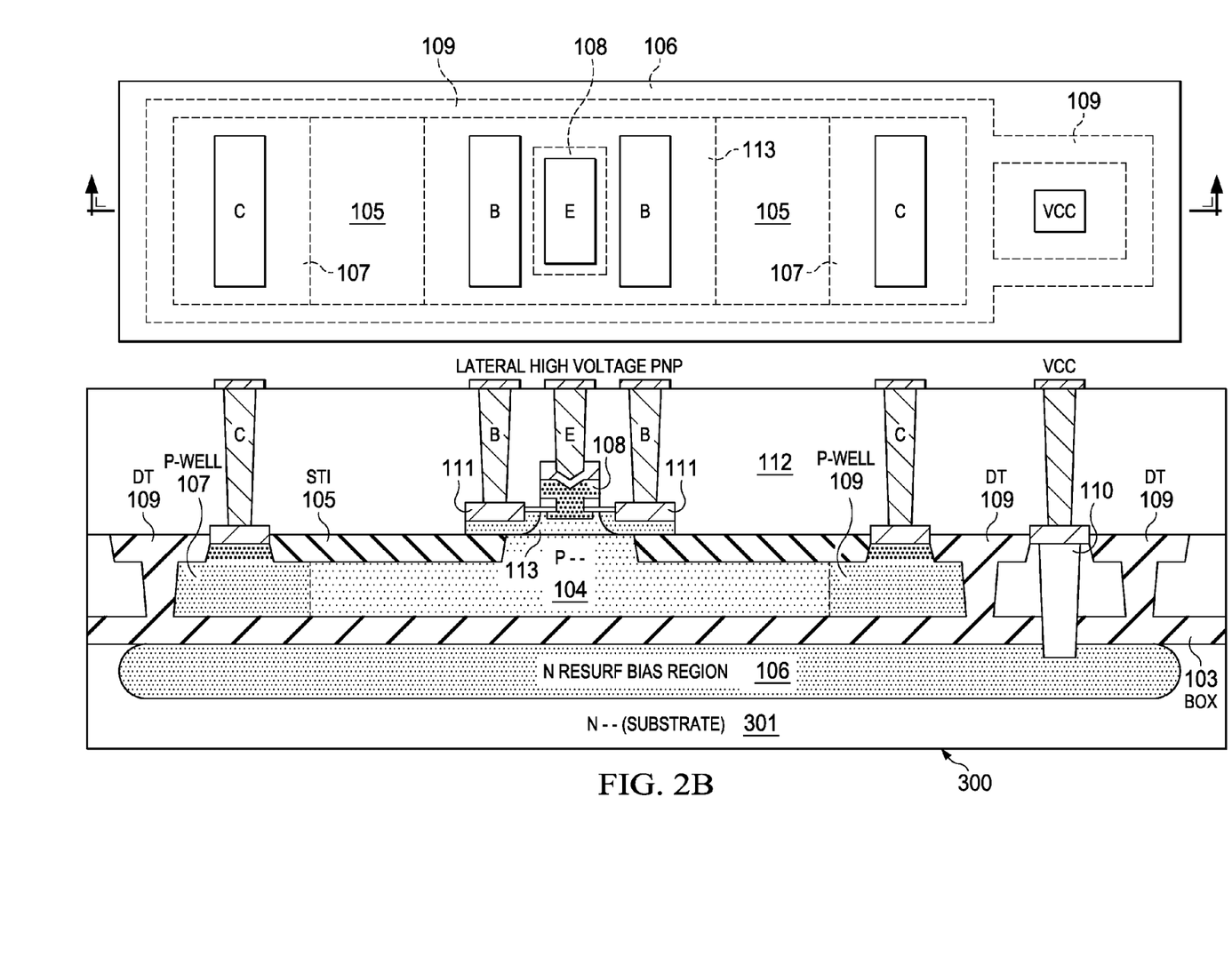
FIG. 2B illustrates an enlarged portion of FIG. 2 detailing the PNP transistor.

In another embodiment of the present invention is shown in FIGS. 2-2B, the complementary PNP 300 and NPN 400 structures include an SOI semiconductor structure having an n-type region 301, active device regions 104 and 204 respectively, and a buried insulator layer (BOX) 103 that lies between, touches, and electrically isolates n-type region 301 from the active device regions 104 and 204. The initial doping level of the active device regions 104 and 204 can be n-type, ~1e14 l/cm3. In the present example, both the n-type region 301 and the active device regions 104 and 204 are implemented with single-crystal silicon. To create a structure that has higher PNP BV, an n-type region 106 is included under a buried insulator layer (BOX) 103 of the PNP 300 transistor, by implanting donor impurity of about 2e15 to 1e17 through the active device region of the SOI wafer and BOX 103 (1.5-2 um in total) into n-type region 301. In addition, a structure that yields higher NPN 400 BV, includes p-type region 406 under the buried insulator layer (BOX) 103 of the NPN transistor, by implanting accepter impurities of about 2e15 to 1e17 through the active device region 204 of the SOI wafer and BOX 103 (1.5-2 um in total) into n-type region 301. Later in the process flow, the n-type region 106 and the p-type regions 406 are connected from the top by doped poly-silicon plugs and are biased at Vcc and GND respectively. Since the substrate is n-type material, Vcc can be applied to either the n-type region 301 or the top contact Vcc. In this case it will deplete lateral portions of both the PNP and NPN collector regions and hence, will increase their BVs.

The structure providing a PNP transistor 300 with a higher BV FIG. 2B is described below.

First an SOI wafer is provided as described in the present invention as shown in FIGS. 2-2B.

Next, a first masking and implant step is accomplished to create a highly (~1e17 l/cm3) doped n-layer 106 under BOX 103 in PNP area. The highly doped n-layer 106 is vertically under the PNP area and extends toward an n-type poly-silicon plug 110 and couples to that plug.

A second new masking and implant step after Pad Oxidation, before Nitride deposition is performed to create a uniform collector doping between 3e14-3e16 in active device region 104.

A Third masking and etching step is accomplished to provide a hard mask for defining and to for deposition of a shallow trench insulation layer STI 105 in the active device region 104.

Deep trenches 109 are formed to encircle the PNP transistor 300 and the n-type poly-silicon plug 110. The trenches extend from the top of the die to the bottom of the BOX 103 and the n-type poly-silicon plug 110 extends from the top of the die to and through the BOX 103 extending into the highly doped n-layer 106 under the BOX 103, wherein the n-type poly-silicon plug 110 touches the implanted n-layer under the BOX 103 and extends to the top of die providing a top contact to the implanted n-layer 106.

A base epitaxial semiconductor layer 113 is deposited, defined and doped with an impurity of the opposite conductivity type on top of the active device region 104 with a base contact 111 coupled thereto.

And finally an emitter region 108 covers a portion of the base epitaxial semiconductor layer 113, wherein the emitter region 108 is highly doped with the same conductivity type as the first epitaxial layer 104.

The structure providing an NPN transistor 400 with a high BV FIG. 1B is described below.

First an SOI wafer is provided as described in the present invention as shown in FIGS. 2-2B.

Next, a first masking and implant step is accomplished to create a highly (~1e17 l/cm3) doped p-layer 406 under BOX 103 in NPN area. The highly doped p-layer 106 is vertically under the NPN area and extends toward a p-type poly-silicon plug 210 and couples to that plug.

A second new masking and implant step after Pad Oxidation, before Nitride deposition is performed to create a uniform collector doping between 3e14-3e16 l/cm3 in active device region 204.

A Third masking and etching step is accomplished to provide a hard mask for defining and to for deposition of an insulator layer STI 105 in the active device region 204.

Deep trenches 109 are formed, to encircle the NPN 400 transistor and the p-type poly-silicon plug 210. The trenches extend from the top of the die to the bottom of the BOX 103 and the p-type poly-silicon plug 210 extends from the top of the die to and through the BOX 103 extending into the highly doped p-layer 406 under the BOX 103, wherein the p-type poly-silicon plug 210 touches the implanted p-layer 406 under the BOX 103 and extends to the top of die providing a top contact to the implanted p-layer 406.

A base epitaxial semiconductor layer 213 is deposited, defined and doped with an impurity of the opposite conductivity type on top of the active device region 204 with base contacts 211 coupled thereto.

And finally an emitter region 208 covers a portion of the base epitaxial semiconductor layer 213, wherein the emitter region 208 is highly doped with the same conductivity type as the first epitaxial layer 204.

The base epitaxial semiconductor for the NPN and the PNP can be either SiGe or silicon. The base epitaxial semiconductor can also be deposited in two operations, one for the NPN and one for the PNP.

Figure 3:
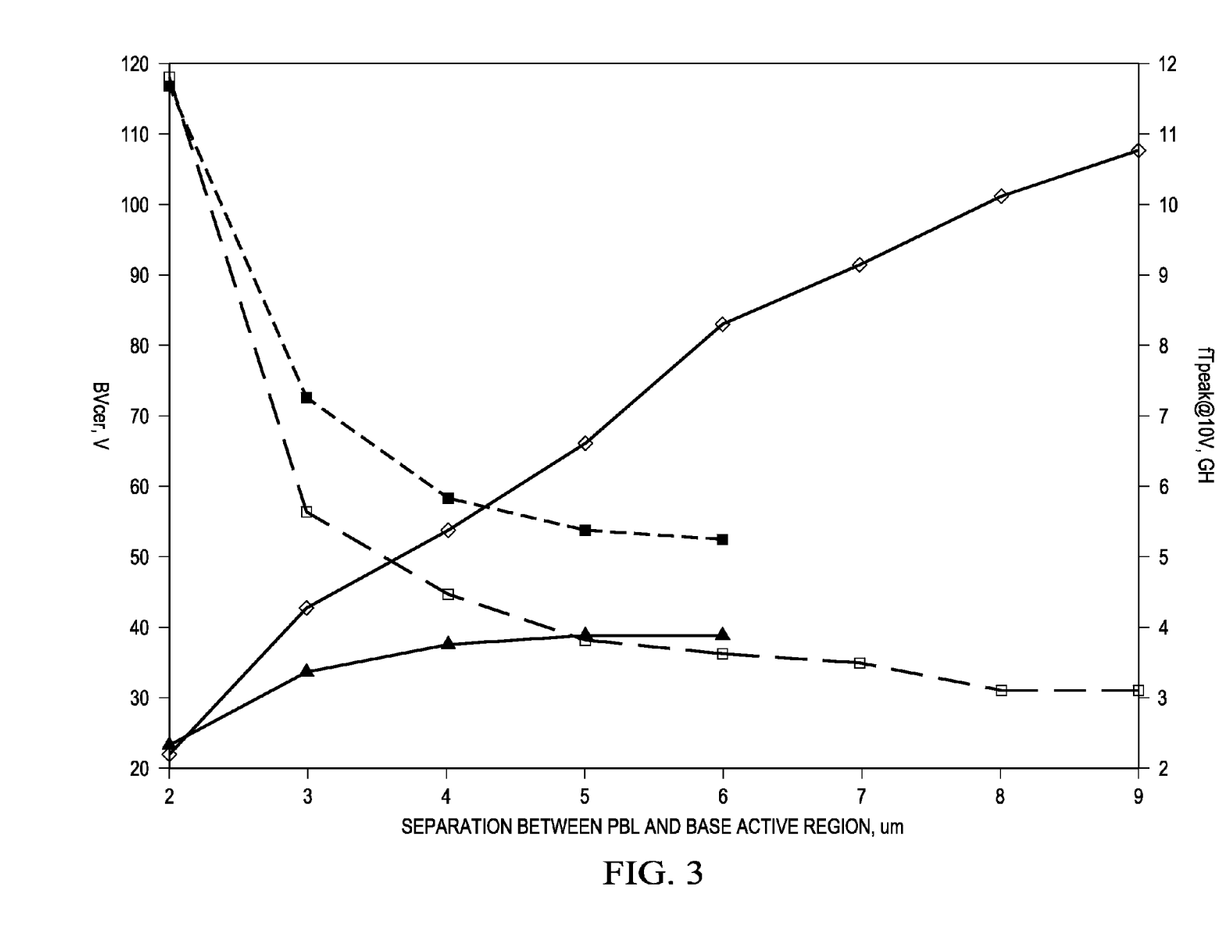
FIG. 3 illustrates the calculated dependencies of $BV_{CER}$ on structures with no resurf and structures including resurf.

FIG. 3 shows the dependencies of $BV_{CER}$ $f_T$ on the resurf n-layer. Calculated dependences of $BV_{CER}$ (solid lines) and $f_T$peak at $V_{CE}=10V$ (dashed lines) for PNP with lateral collector with (diamonds) and without (triangles) resurf N-layer. Note that without N-region, PNP BV saturates at ~38V while with N-region it goes beyond 100V.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a PNP structure, including a first p-type layer, an n-type layer under the first p-type layer, and a second p-type layer under the n-type layer;
   an insulator layer under the second p-type layer;
   an n-type buried region under the PNP structure and the insulator layer; and
   a conductive plug extending from a surface aligning with the second p-type layer to reach the n-type buried region.

2. The integrated circuit of claim 1, wherein the conductive plug includes an n-type polysilicon plug.

3. The integrated circuit of claim 1, further comprising:
   a NPN structure having a first n-type layer, a p-type layer under the first n-type layer, and a second n-type layer under the p-type layer; and
   a deep trench structure extending from the surface to the insulator layer and separating the NPN structure from the PNP structure.

4. The integrated circuit of claim 3, wherein the n-type buried region terminated without extending under the NPN structure.

5. The integrated circuit of claim 1, further comprising:
   a deep trench structure extending from the surface to the insulator layer and laterally surrounding the second p-type layer of the PNP structure.

6. The integrated circuit of claim 1, further comprising:
a second conductive plug extending from the surface to a p-type substrate under the n-type buried layer, the second conductive plug configured to transfer a ground voltage to the p-type substrate.

7. The integrated circuit of claim 6, wherein the second conductive plug includes a p-type polysilicon plug.

* * * * *